US012726003B2

(12) United States Patent
Xu et al.

(10) Patent No.: US 12,726,003 B2
(45) Date of Patent: Sep. 1, 2026

(54) MULTI-SECTION HIGH POWER SEMICONDUCTOR OPTICAL AMPLIFIER (SOA) AND FABRICATION METHOD THEREOF

(71) Applicant: Applied Optoelectronics, Inc., Sugar Land, TX (US)

(72) Inventors: Dapeng Xu, Houston, TX (US); Klaus Alexander Anselm, Sugar Land, TX (US); Huanlin Zhang, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 872 days.

(21) Appl. No.: 18/084,896

(22) Filed: Dec. 20, 2022

(65) Prior Publication Data

US 2024/0204484 A1 Jun. 20, 2024

(51) Int. Cl.
*H01S 5/20* (2006.01)
*H01S 5/02* (2006.01)
*H01S 5/227* (2006.01)
*H01S 5/34* (2006.01)

(52) U.S. Cl.
CPC .......... *H01S 5/2054* (2013.01); *H01S 5/0206* (2013.01); *H01S 5/2275* (2013.01); *H01S 5/34* (2013.01)

(58) Field of Classification Search
CPC .... H01S 5/2054; H01S 5/0206; H01S 5/2275; H01S 5/34
USPC .......................................................... 359/344
See application file for complete search history.

(56) References Cited

U.S. PATENT DOCUMENTS 12,355,209 B1 * 7/2025 Skogen ................ H01S 5/2031
2006/0268397 A1 11/2006 Saini et al.

OTHER PUBLICATIONS

F. Koyama, K.Y. Liou, A.G. Dentai, T.Tanbun-Ek, C.A. Burrus, "Multiple-Quantum-Well GaInAsP Tapered Broad-Area Amplifiers with Monolithically Integrated Waveguide Lens for High-Power Applications", IEEE Photonics Technology Letters, vol. 5, No. 8, Aug. 1993, pp. 916-919.

* cited by examiner

*Primary Examiner* — Daniel A Hess
(74) *Attorney, Agent, or Firm* — Secant IP, P.L.L.C.

(57) ABSTRACT

A multi-section semiconductor optical amplifier (SOA) includes at least two sections in series—an input section at an input side and an output section at an output side—with the input section having a higher optical confinement (also referred to as a high gamma) and the output section having a lower optical confinement (also referred to as a low gamma). The input section may also have a shorter length than the output section. The multi-section structure allows optimizing the input side and the output side design separately such that the input section provides a high gain section configured to quickly increase optical power and the output section provides a low differential gain section that improves saturation. As a result, the multi-section SOA can achieve higher output power with high gain and lower signal noise while demanding low input power.

13 Claims, 11 Drawing Sheets

MULTI-SECTION HIGH POWER SEMICONDUCTOR OPTICAL AMPLIFIER (SOA) AND FABRICATION METHOD THEREOF

TECHNICAL FIELD

The present disclosure relates to semiconductor optical devices, and more particularly, to multi-section semiconductor optical amplifiers (SOAs) and fabrication methods thereof.

BACKGROUND INFORMATION

Semiconductor optical amplifiers (SOAs) may be used in a variety of applications, such as telecom applications and LIDAR applications. In telecom applications, SOAs may be used to amplify optical signals in optical transmission systems. In LIDAR applications, SOAs may be used for 3D sensing including automotive LIDAR and high resolution industrial sensing applications. One challenge with existing SOAs is generating relatively high output power with high gain and relatively low noise, particularly for long distance sensing.

SUMMARY

Consistent with an aspect of the present disclosure, a multi-section semiconductor optical amplifier (SOA) includes an input section disposed at an input side of the semiconductor optical amplifier and an output section disposed at an output side of the semiconductor optical amplifier. The input section has a first optical confinement factor Γ1 and provides a first optical gain, and the output section has a second optical confinement factor Γ2 and provides a second optical gain. The first optical confinement factor Γ1 is higher than the second optical confinement factor Γ2, and wherein the first optical gain is higher than the second optical gain.

Consistent with another aspect of the present disclosure, a method of fabricating a semiconductor optical amplifier (SOA) includes: providing a substrate; depositing, on the substrate, a buffer layer, a first bottom separate confinement heterostructure (SCH) layer and a cap layer to form a starting structure; depositing a patterning mask layer on a portion of the starting structure; etching another portion of the starting structure layer to form a mesa structure and to expose a portion of the buffer layer; depositing a side layer on the portion of the buffer layer on one side of the mesa structure; removing the patterning mask layer; and depositing, on the cap layer and the side layer, a second bottom SCH layer, a MQW layer, a top SCH layer and at least one top cladding layer, wherein the second bottom SCH layer, the MQW layer, and the top SCH layer form a portion of an active region extending across both an input section and an output section of the SOA, and wherein the first bottom SCH layer forms a portion of the active region extending only in the output section of the SOA.

Consistent with a further aspect of the present disclosure, a method of fabricating a semiconductor optical amplifier (SOA) includes: providing a substrate; depositing, on the substrate, a buffer layer, a first bottom SCH layer, a first MQW layer, a first top SCH layer, and a first cap layer to form a first SOA active structure including a first active region; depositing a patterning mask layer on a portion of the first SOA active structure; etching another portion of the first SOA active structure to form a mesa structure and to expose a portion of the buffer layer; depositing, on the portion of the buffer layer, a second bottom SCH layer, a second MQW layer, a second top SCH layer, and a second cap layer to form a second SOA active structure including a second active region; removing the patterning mask layer; depositing at least one top cladding layer on the cap layers, wherein first active region is located in an input section and the second active region is located in an output section, and wherein the first bottom layer in the input section is thinner than the second bottom layer in the output section.

BRIEF DESCRIPTION OF THE DRAWINGS

These and other features and advantages will be better understood by reading the following detailed description, taken together with the drawings wherein.

DETAILED DESCRIPTION

A multi-section semiconductor optical amplifier (SOA), consistent with embodiments of the present disclosure, includes at least two sections in series—an input section at an input side and an output section at an output side—with the input section having a higher optical confinement (also referred to as a high gamma) and the output section having a lower optical confinement (also referred to as a low gamma). The input section may also have a shorter length than the output section. The multi-section structure allows optimizing the input side and the output side designs separately such that the input section provides a high gain section configured to quickly increase optical power and the output section provides a low differential gain section that improves saturation. As a result, the multi-section SOA can achieve higher output power with lower signal to noise ratio while demanding low input power.

In some embodiments, the input and output sections of a multi-section SOA may be fabricated with the same active region. In other embodiments, the input and output sections of a multi-section SOA may be fabricated with different active regions. The different optical confinement in the input and output sections may be achieved using separate confinement heterostructure (SCH) layers (e.g., N-SCH layers) with different thicknesses, as will be described in greater detail below.

As used herein, "high gamma" refers to a relatively higher optical confinement factor F as compared to other sections in the SOA and "low gamma" refers to a relatively lower optical confinement factor Γ as compared to other sections in the SOA. In some embodiments, the high gamma or relatively high optical confinement factor Γ is in a range of about 2% to 15% and the low gamma or relatively low optical confinement factor Γ is in a range of about 1% to 9%.

Figure 1:
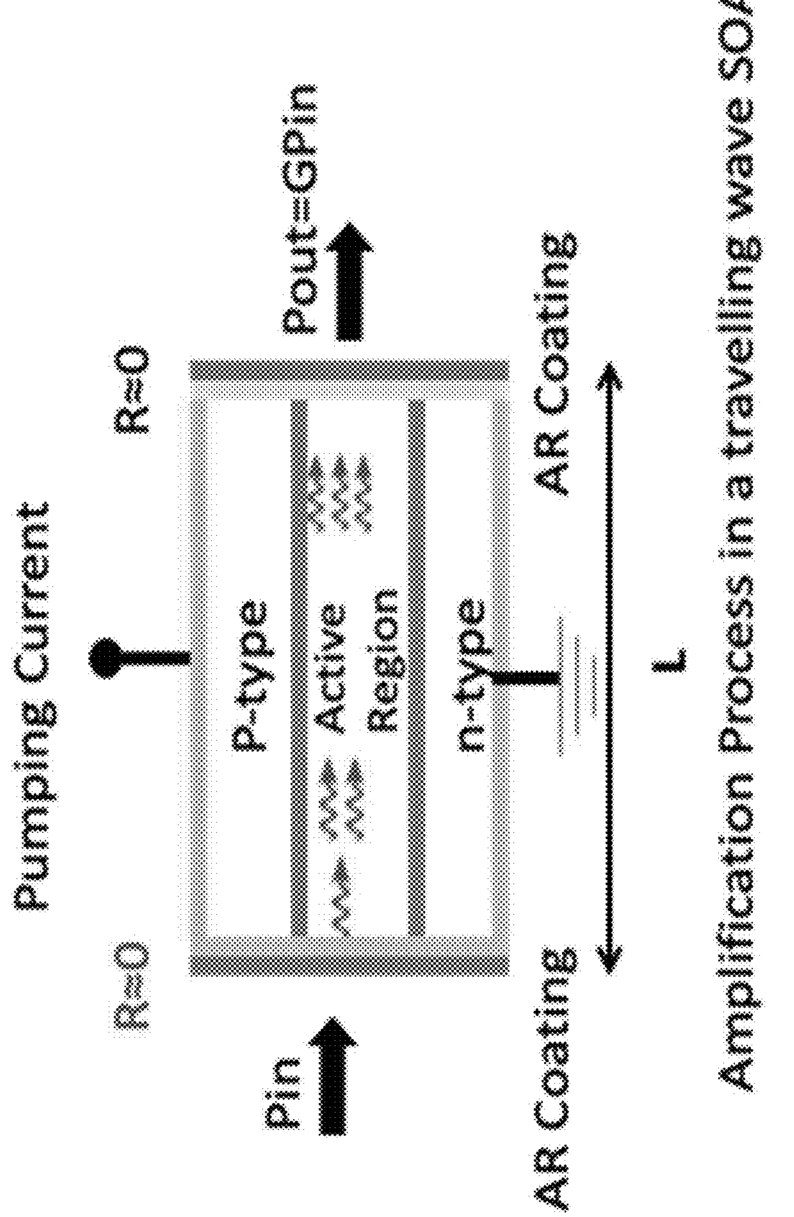
FIG. 1 is a schematic diagram illustrating the basic operating principle of a semiconductor optical amplifier (SOA).

Referring to FIG. 1, the basic structure and operation of a SOA (also referred to as a traveling-wave amplifier) is described. A SOA may include an active region between p-type and n-type layers with conductive layers on the top and bottom and anti-reflective (AR) coatings on the input and output sides. An electrical current is applied to one of the conductive layers to pump the active region and an optical signal is coupled into the input side. The optical signal is amplified due to stimulated emission as the optical signal passes through the active region of the SOA. The optical input signal having an input power $P_{in}$ is thus amplified to produce an optical output signal with an output power $P_{out}=G \cdot P_{in}$, where G is the amplifier gain.

The single-pass gain of a traveling-wave amplifier, which is known as the unsaturated gain, $G_0$, of the amplifier, is given by:

$$G_0 = \exp(g_0 * L) \tag{1}$$

wherein, $g_0$ is net gain and L is the length of the gain section. The amplifier gain G is given by:

$$G = G_0 \cdot \exp\left(-\left(\frac{G-1}{G}\right) \cdot \left(\frac{P_{out}}{P_s}\right)\right) \tag{2}$$

where $P_{out}$ is the optical output power and $P_s$ is the saturation optical power of the amplifier. As shown by equation (2), the saturation power $P_s$ limits the maximum output. In other words, the amplifier gain decreases when $P_{out} \approx P_s$.

An output saturation optical power $P_{sout}$ is defined as the output optical power at which the gain decreases to half of its unsaturated value and may be determined as follows:

$$P_{sout} = \frac{G_0 In2}{G_0 - 2} P_s \tag{3}$$

The saturation optical power $P_s$ of the amplifier is given by:

$$P_s = \left(\frac{dw}{\Gamma}\right)\left(hv\frac{1}{\alpha}\frac{1}{\tau_s}\right) \tag{4}$$

wherein d is the thickness of the active region, w is width of the active region, Γ is the optical confinement factor, h is Plank's constant, v is optical frequency, α is differential gain, and $\tau_s$ is carrier lifetime.

A signal to noise ratio (SNR) indicates the level difference measured between the noise and the signal. Amplifiers degrade the SNR of an amplified signal primarily by the amplified spontaneous emission adding to the signal. The effect of spontaneous emission is to add fluctuations in the signal, which also adds noise to the detected photocurrent. The SNR degradation is generally characterized by a quantity called noise figure nf. The noise figure nf in terms of the population inversion factor $n_{sp}$ and gain G is shown in the equation below:

$$nf = \frac{2n_{sp}(G-1)}{G} + \frac{1}{G} \tag{5}$$

wherein G is the amplifier gain. Usually G>>1, so the noise figure nf is directly proportional to the population inversion factor $n_{sp}$. The population inversion factor $n_{sp}$ is defined as below:

$$n_{sp} = \frac{N}{N - N_0} \cdot \frac{g}{g - \frac{\alpha}{\Gamma}} \tag{6}$$

where α is differential gain, Γ is the optical confinement factor, and N is carrier density and $N_0$ is transparency carrier density. Thus, a low optical confinement factor Γ results in a high population inversion factor $n_{sp}$ and noise figure nf, and a low differential gain α results in a low population inversion factor $n_{sp}$ and a low noise figure nf.

The saturation optical power $P_s$ may be improved in several different ways—increasing the geometry size of the active region (e.g., thickness d or width w of an active layer), decreasing the optical confinement factor Γ, decreasing the differential gain α, and/or decreasing the carrier lifetime $\tau_s$. Each of these methods for improving saturation optical power $P_s$ presents certain challenges.

With respect to increasing the geometry of the active region, the optical confinement Γ increases with the increase of the thickness d, therefore the saturation optical power $P_s$ cannot be improved much by increasing thickness. Furthermore, in most cases, the width w of the active layer is less than 4 μm due to coupling loss or single mode operation considerations. If width of the active layer is not a limiting factor, a tapered broad-area SOA design may achieve high power, but this design may have coupling loss issues. In particular, due to the asymmetric and astigmatic output mode, the coupling loss significantly increases and may require remedies, such as an integrated lens or MMI configuration.

With respect to the decreasing differential gain, large positive photoluminescence (PL) detuning may be needed because negative PL detuning increases differential gain and positive PL detuning reduces the differential gain. However, the positive PL detuning increases the internal loss $\alpha_i$ and reduces the material gain g, and as a result, decreases the net gain $g_0$ as shown below:

$$g_0 = \Gamma g - \alpha_i \tag{7}$$

Because the net gain $g_0$ is reduced, a long device may be needed to achieve a desired amplifier gain $G_0=\exp(g_0*L)$.

With respect to decreasing optical confinement to increase saturation optical power $P_s$, decreasing optical confinement Γ will also decrease the net gain $g_0$, as shown in the equation (7) above. Decreasing optical confinement may also result in a higher noise figure.

Maximum output power of a SOA is limited by: 1) saturation power $P_s$; 2) carrier leakage out of the active region; and 3) thermal effect. With respect to carrier leakage, carriers are not clamped in the SOA, so carrier leakage may occur due to thermionic emission as the SOA is pumped with high current or at high temperature. The leakage may lead to a reduction in the internal quantum efficiency and an optical power roll-over. With respect to thermal effect, increasing temperature increases loss and reduces material gain, and the net gain may be negative at a certain current/temperature.

The dissipated electrical power at the current I for a SOA is shown as below:

$$P(I) = V*I - (P_{out} - P_{in}) = VI - (G-1)*P_{in} \tag{8}$$

where V is operating voltage, I is operating current, and G is amplifier gain. Self-heating occurs for increasing temperature as shown as below:

$$\Delta T(I) = P(I)*R_{th} \tag{9}$$

wherein $R_{th}$ is thermal resistance.

Thus, low optical confinement or low differential gain may lead to low net gain and amplifier gain, and as a result, has more significant self-heating and results in negative net gain at lower operating current and higher carrier leakage. The lower input power may also have higher self-heating, and at low input power, the maximum output power is limited by self-heating, not by saturation power $P_s$.

Figure 2B:
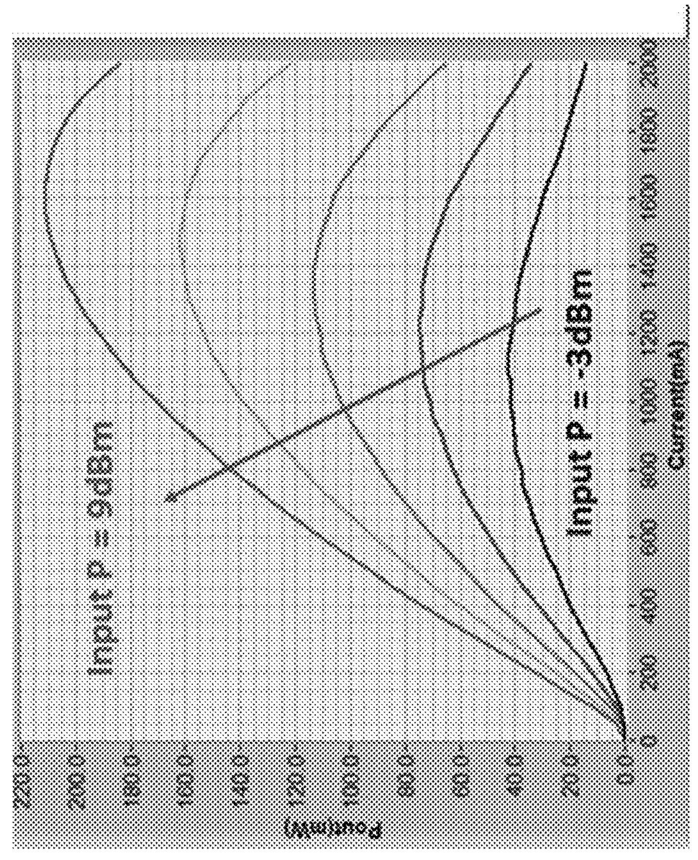
FIG. 2B is a graph illustrating curves of output power $P_{out}$ v. Current for different input powers (Input P) in a low optical confinement SOA.
Figure 2A:
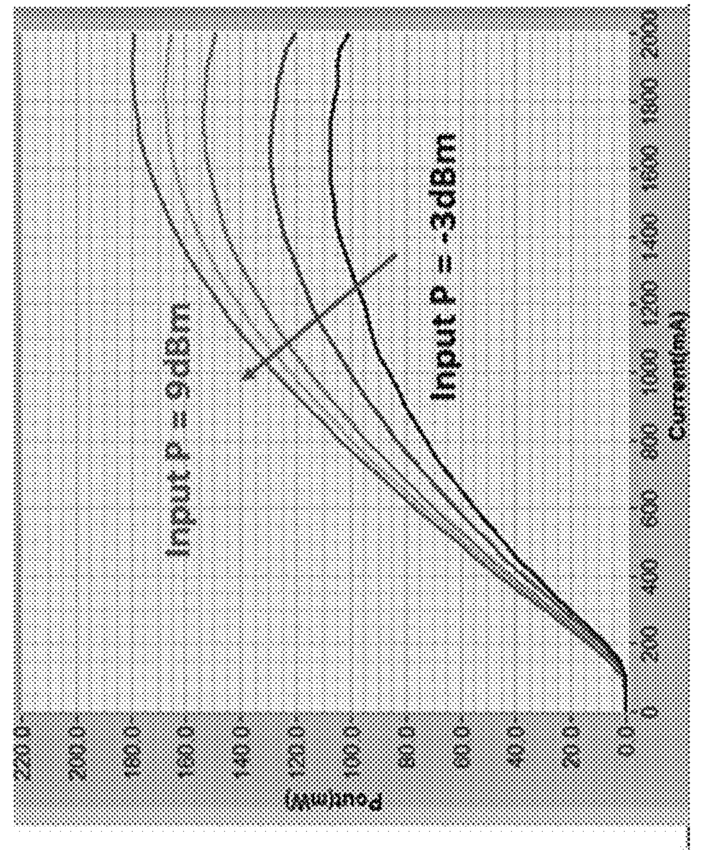
FIG. 2A is a graph illustrating curves of output power $P_{out}$ v. Current for different input powers (Input P) in a high optical confinement SOA.

FIGS. 2A and 2B illustrate output power $P_{out}$ v. Current for different input powers (Input P) in a high optical confinement SOA (FIG. 2A) and a low optical confinement SOA (FIG. 2B). As shown, low input power limits maximum output power because of self-heating. The SOA with a low optical confinement factor Γ has a lower thermal roll off current due to more self-heating but has higher saturation power. Thus, the benefit of low optical confinement for higher output power may be achieved with higher input power.

One possible solution to improve saturation power and/or noise figure is to vary the series resistance along the length of a SOA device by patterning openings in the dielectric layer above the current metallization to achieve non-uniform current injection such that a high current injection area has a relatively high gain. Not fully connecting the metal contact, however, may increase overall device resistance and cause self-heating, which degrades device performance. The non-uniform resistance along the cavity length may also bring local heating spots and cause weak spots for reliability.

Thus, designing a SOA with high maximum output power and a low noise figure presents significant challenges, especially with new SOAs that are designed to provide high maximum output power and a low noise figure within a relatively small form factor. Attempts at increasing the geometry size of the active section, decreasing the optical confinement, decreasing the differential gain, and decreasing the carrier lifetime, all bring different issues as discussed above. In contrast, a multi-section SOA, consistent with embodiments of the present disclosure, is capable of increasing the saturation power while also suppressing the lower noise figure by providing different sections with different optical confinements.

Figures 3, 4:
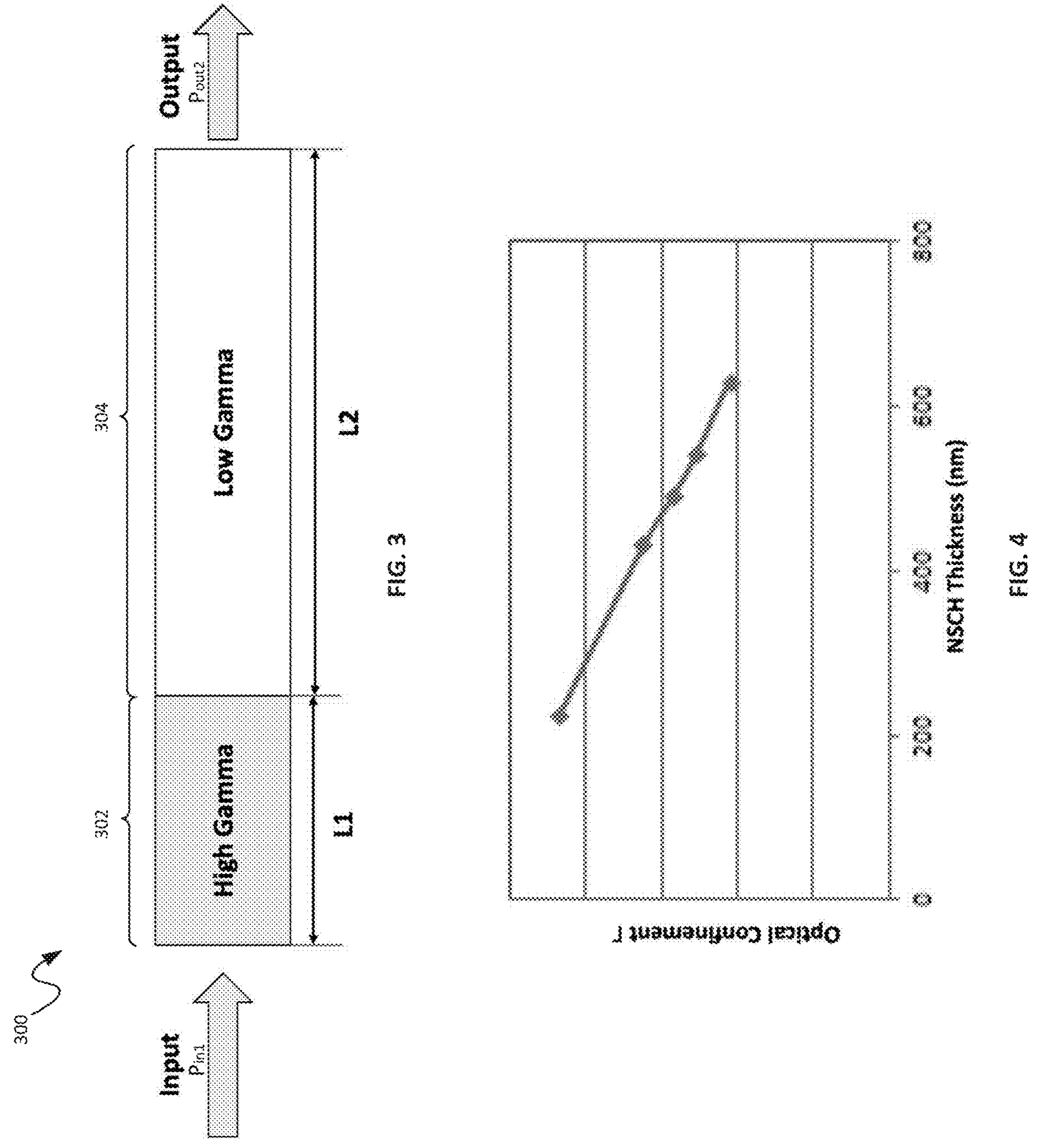
FIG. 3 is a schematic diagram of a multi-section SOA, consistent with embodiments of the present disclosure.
FIG. 4 is a graph illustrating optical confinement as a function of thickness of an N-type separate confinement heterostructure (SCH) layer in an SOA.

Referring to FIG. 3, a multi-section SOA 300, consistent with embodiments of the present disclosure, is described in greater detail. Although the illustrated embodiment shows the multi-section SOA 300 with two sections, a multi-section SOA may include more than two sections. The multi-section SOA 300 includes at least an input section 302 at an input side with a relatively high optical confinement factor Γ1 (high gamma) and an output section 304 at an output side with a relatively low optical confinement factor Γ2 (low gamma). The relatively high optical confinement factor Γ1 (high gamma) of the input section 302 is higher than the relatively low optical confinement factor Γ2 (low gamma) of the output section 304. As mentioned above, the high gamma or relatively high optical confinement factor Γ1 may be in a range of about 2% to 15% and the low gamma or relatively low optical confinement factor Γ2 may be in a range of about 1% to 9%.

The input section 302 with the relatively high optical confinement factor Γ1 also has a length L1 that is less than the length L2 of the output section 304 with the relatively low optical confinement factor $\Gamma_2$. In some embodiments, the length L1 of the input section 302 is in a range of 100 μm to 1 mm and the length L2 of the output section 304 is in a range of 1 mm to 4 mm.

The input section 302 with the high gamma provides a high differential gain stage that quickly increases optical power. The output section 304 with the low gamma provides a low optical gain stage with high saturated optical power. Although the low optical gain stage has a higher noise figure in addition to the higher saturation power, the noise figure at the input side is greatly improved by the high gamma structure and results in a low noise figure overall for the SOA.

The input section 302 at the input side of the SOA receives an input light with an input power $P_{in1}$ and amplifies the light with high optical gain, and the output section 304 receives the light amplified by the input section 302, further amplifies the light with low optical gain, and outputs the amplified light with an output power $P_{out2}$. In one example, light with an input power $P_{in1}$ of 1 dbm is amplified by the input section 302 with a gain of 10 db to produce light with an input power of 11 dbm input to the output section 304, which is further amplified with an additional gain of 15 db. Thus, the multi-section SOA 300 may receive light with an input power $P_{in1}$ of 1 dbm and output light with an output power $P_{out2}$ of 26 dbm, providing a total of 25 db gain. This may not be achieved using only a high gamma section due to saturation and may not be achieved using only a low gamma section due to thermal issues and current leakage, as discussed above.

In some embodiments, separate confinement heterostructure (SCH) layers form the active region(s) in a multi-section SOA and different optical confinement factors may be achieved by using different thicknesses for SCH layers, such as an N-type SCH (NSCH) layer. FIG. 4 shows that the optical confinement decreases with an increasing thickness of the NSCH layer. Thus, a multi-section SOA, consistent with embodiments of the present disclosure, may include less thickness for the NSCH layer(s) at the input side and more thickness for the NSCH layer(s) at the output side.

Figure 5:
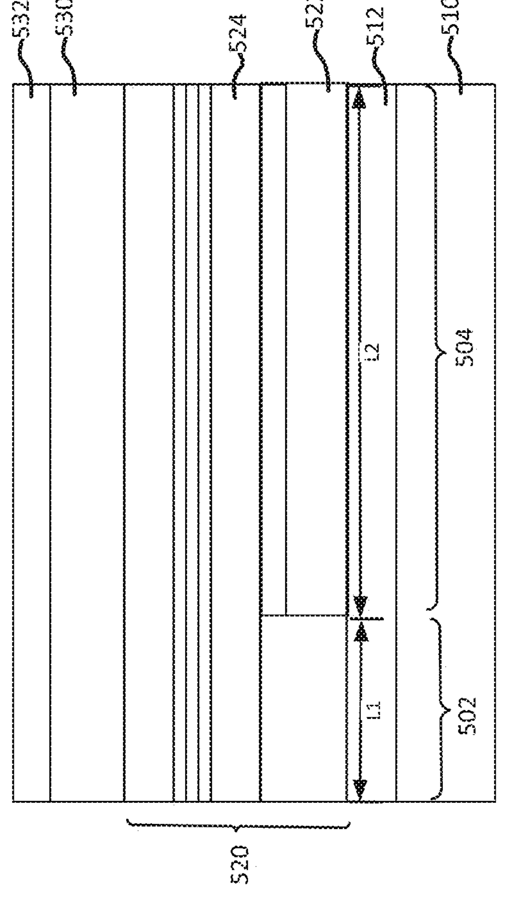
FIG. 5 is a schematic cross-sectional view of an embodiment of a two-section SOA, consistent with the present disclosure, including an input section and an output section fabricated with the same active region.

FIG. 5 shows an embodiment of a two-section SOA 500 with the input section 502 and the output section 504 being fabricated from the same active region. As discussed above, the input section 502 has a high gamma and relatively shorter length L1 and the output section 504 has a low gamma and relatively longer length L2. In the illustrated embodiment, the SOA 500 includes a semiconductor substrate 510, a buffer layer 512 on the semiconductor substrate 510, an active region 520 on the buffer layer 512, and cladding layers 530, 532 on the active region 520. The active region 520 includes a first bottom SCH (e.g. N-SCH) layer 522 only in the output section 504 and a second bottom SCH (e.g. N-SCH) layer 524 that extends through both the input section 502 and the output section 504. The additional bottom SCH (e.g. N-SCH) layer 522 in only the output section 504 achieves the low gamma in the output section 504 as compared to the input section 502.

Figure 6A:
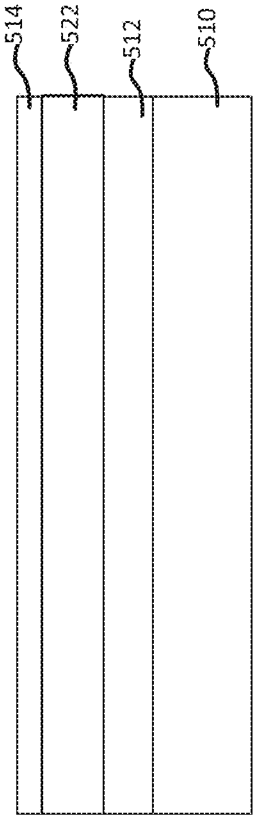
FIGS. 6A-6F illustrate fabrication of the embodiment of the two-section SOA shown in FIG. 5.
Figure 6B:
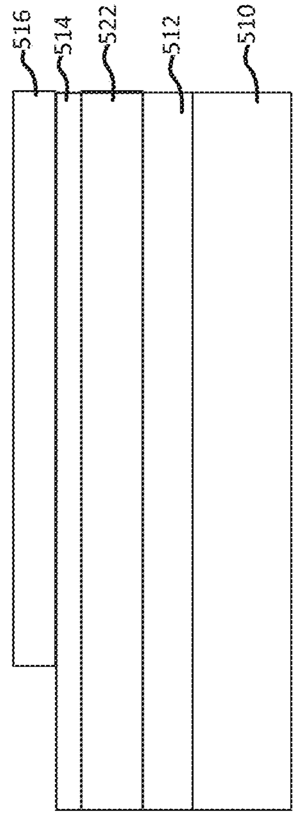
Figure 6C:
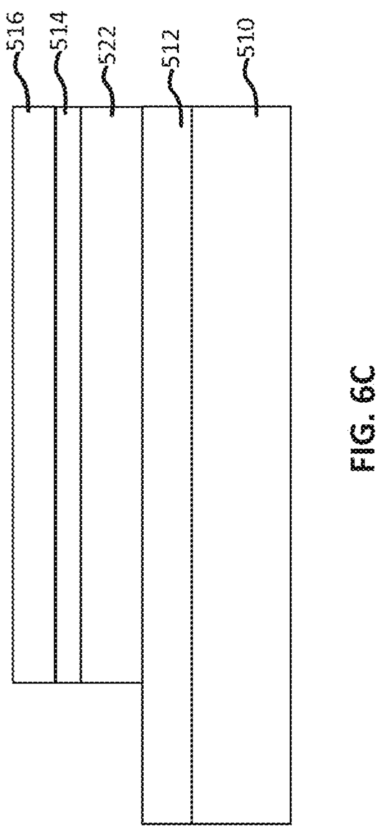
Figure 6D:
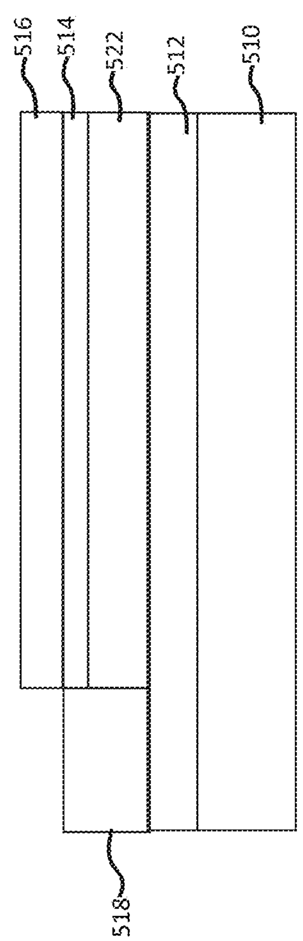
Figure 6E:
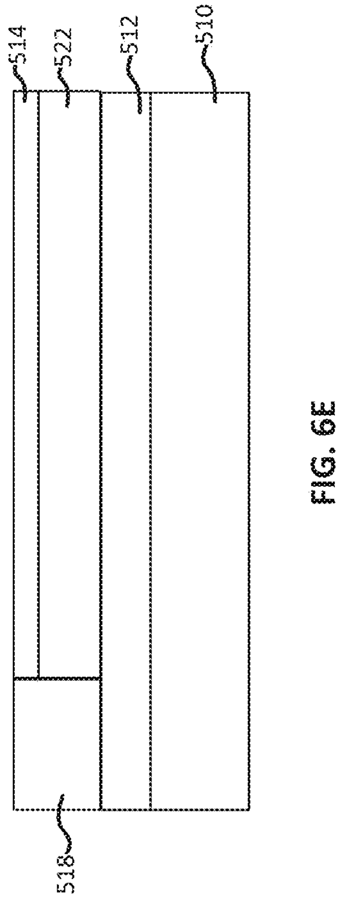
Figure 6F:
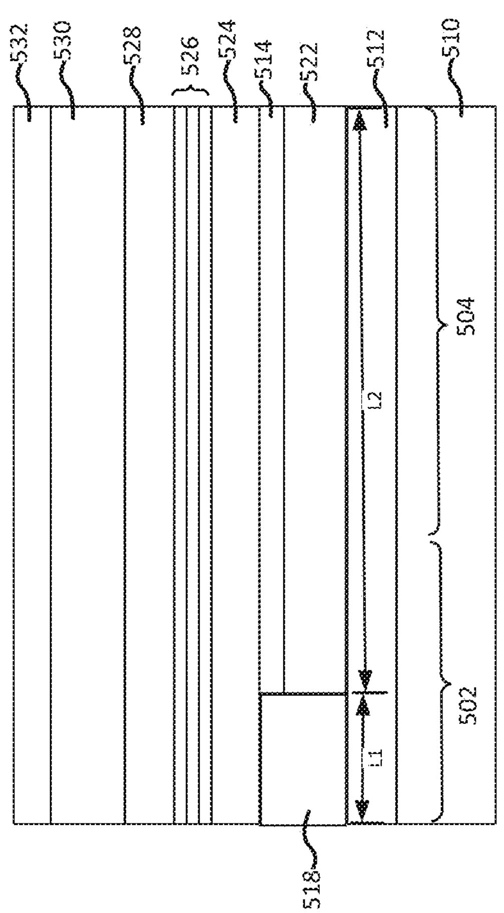

FIGS. 6A-6F illustrate one example of a method of fabrication of the two-section SOA 500 with the input section 502 and the output section 504 being fabricated from the same active region. As shown in FIG. 6A, a starting structure is formed by depositing the buffer layer 512 (e.g., InP Buffer layer) on the semiconductor substrate 510, depositing a first N-SCH layer 522 (e.g., InGaAsP N-SCH layer) on the buffer layer 512, and depositing a cap layer 514 (e.g., InP cap layer) on the first N-SCH layer 522. As shown in FIG. 6B, a patterning mask layer 516 (e.g., SiO2) is deposited on a portion of the cap layer 514 of the starting structure. As shown in FIG. 6C, another portion of the cap layer 514 and the first N-SCH layer 522 is etched, e.g., using wet etching, to form a mesa structure and expose a portion of the buffer layer 512. As shown in FIG. 6D, a side layer 518 (e.g., InP) is deposited by regrowth on the exposed portion of the buffer layer 512 on one side of the mesa structure adjacent to the cap layer 514 and the first N-SCH layer 522. As shown in FIG. 6E, the patterning mask layer 516 is removed, and as shown in FIG. 6F, the remaining layers are deposited by regrowth including the second N-SCH layer 524, multiple quantum well (MQW) layers 526, a P-SCH layer 528 (e.g., InGaAsP P-SCH layer), a first P-type cladding layer 530 (e.g., P—InP layer), and a second P-type cladding layer 532 (e.g., P—InGaAs layer).

Figure 7:
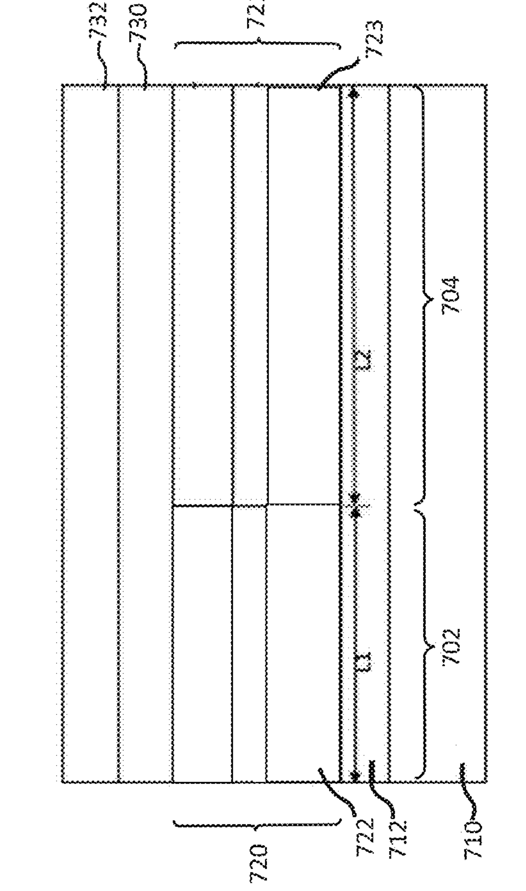
FIG. 7 is a schematic cross-sectional view of another embodiment of a two-section SOA, consistent with the present disclosure, including an input section and an output section fabricated with different active regions.

FIG. 7 shows an embodiment of a two-section SOA 700 with an input section 702 and an output section 704 being fabricated from different active regions. As discussed above, the input section 702 has a high gamma and relatively shorter length L1 and the output section 704 has a low gamma and relatively longer length L2. In the illustrated embodiment, the SOA 700 includes a semiconductor substrate 710, a buffer layer 712 on the semiconductor substrate 710, first and second active regions 720, 721 on the buffer layer 512, and cladding layers 730, 732 on the active regions 720, 721. Different gammas may be achieved in the first and second active regions 720, 721 in the respective input and output sections 702, 704 by different SCH compositions, different SCH thicknesses and/or different MQW layers.

Figure 8A:
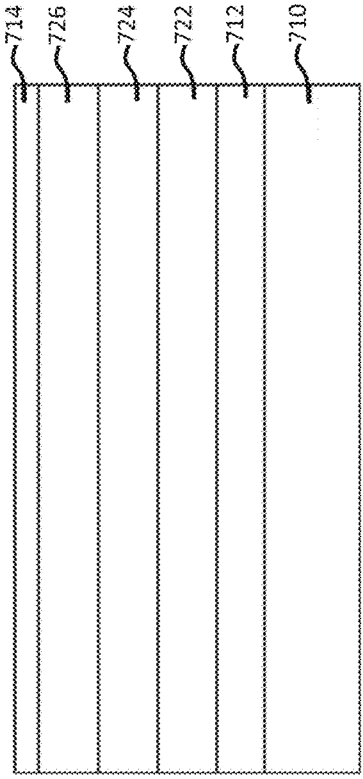
FIGS. 8A-8F illustrate fabrication of the embodiment of the two-section SOA shown in FIG. 7
Figure 8B:
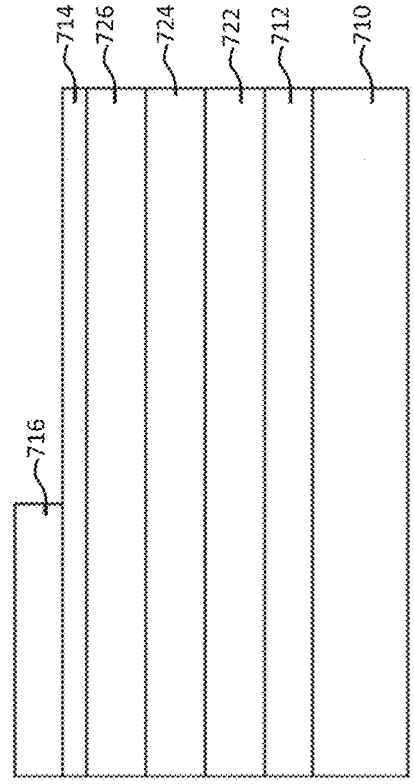
Figure 8C:
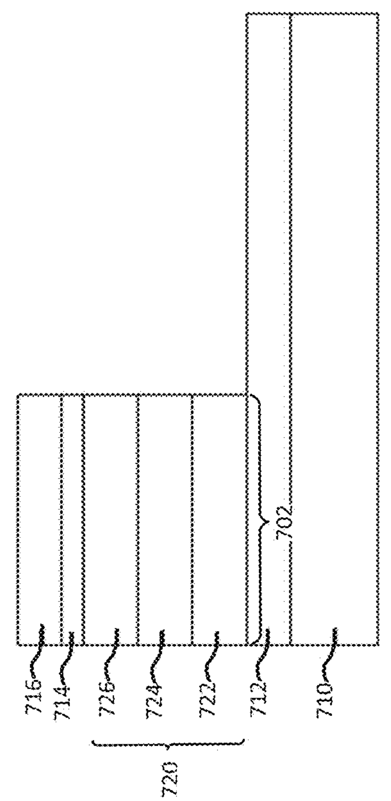
Figure 8D:
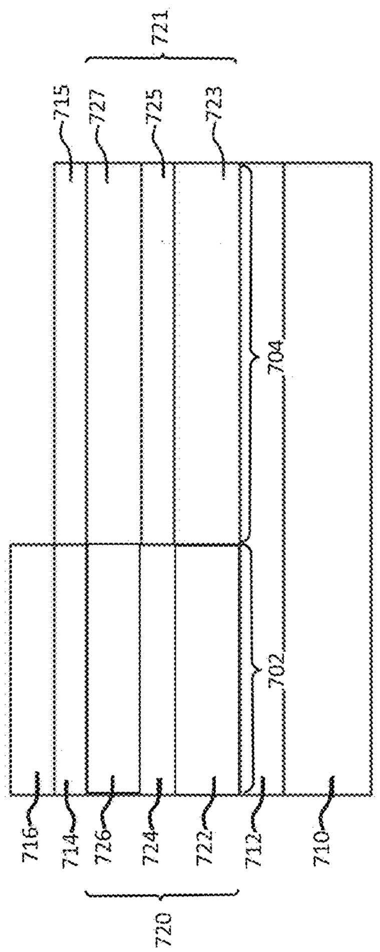
Figure 8E:
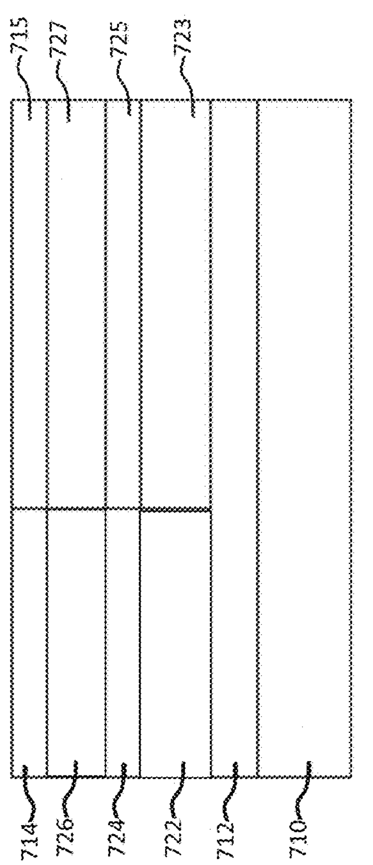
Figure 8F:
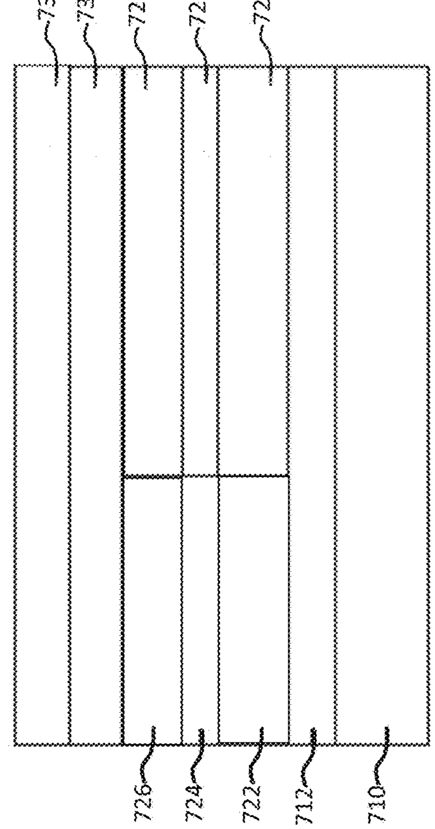

FIGS. 8A-8F illustrate one example of a method of fabrication of the two-section SOA 700 with the input section 702 and the output section 704 from different active regions. As shown in FIG. 8A, a first SOA active structure is formed by depositing the buffer layer 712 (i.e., InP buffer) on the substrate 710 (e.g., InP substrate), depositing the first N-SCH layer 722 (e.g., InGaAsP N-SCH layer) on the buffer layer 712, depositing a first MQW layer 724 on the first N-SCH layer 722, depositing a first P-SCH layer 726 (e.g., InGaAsP P-SCH layer) on the first MQW layer 724, and depositing a cap layer 714 (e.g., InP cap layer) on the P-SCH layer 726. As shown in FIG. 8B, a patterning mask layer 716 (e.g., SiO2) is deposited on a portion of the cap layer 714. As shown in FIG. 8C, exposed portions of the N-SCH layer 722, the MQW layer 724, the P-SCH layer 726, and the cap layer 714 are removed, e.g., using wet etching, resulting in a mesa structure that forms the first active region 720 in the input section 702. As shown in FIG. 8D, a second N-SCH layer 723 (e.g., InGaAsP N-SCH layer), a second MQW layer 725, a second P-SCH layer 727 (e.g., InGaAsP P-SCH layer), and a second cap layer 715 (e.g., InP cap layer) are deposited adjacent to the mesa structure, e.g., as a butt joint regrowth, to form a second SOA active structure including the second active region 721 in the output section 704. As shown in FIG. 8E, the patterning mask layer 716 is removed, and as shown in FIG. 8F, a first P-type cladding layer 730 (e.g., P—InP layer) and a second P-type contact layer 732 (e.g., P—InGaAs layer) are deposited.

Both of the above methods for fabrication may use semiconductor fabrication techniques known for use in fabricating single stage SOAs. For example, the layers may be deposited by regrowth, for example, using metalorganic chemical vapor deposition (MOCVD).

Accordingly, a multi-section semiconductor optical amplifier (SOA), consistent with the present disclosure, may be manufactured with same active region or different active regions to provide an input section with high gamma and an output section with low gamma. The high optical confinement at the input side allows low input power and achieves a low noise, high power SOA. The low optical confinement at the output side boosts the saturation power and output power.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A multi-section semiconductor optical amplifier (SOA), comprising:

an input section disposed at an input side of the semiconductor optical amplifier, the input section having a first optical confinement factor Γ1 along a first length L1 of the input section, and wherein the input section provides a first optical gain;

an output section disposed at an output side of the semiconductor optical amplifier and adjacent the input section, the output section having a second optical confinement factor Γ2 along a second length L2 of the output section, and wherein the output section provides a second optical gain; and wherein the first optical confinement factor Γ1 is higher than the second optical confinement factor Γ2, and wherein the first optical gain is higher than the second optical gain.

2. The multi-section semiconductor optical amplifier according to claim 1 wherein the first optical confinement factor Γ1 is in a range of 2% to 15% and the second optical confinement factor Γ2 is in a range of 1% to 9%.

3. The multi-section semiconductor optical amplifier according to claim 1 wherein the second length L2 is longer than the first length L1.

4. The multi-section semiconductor optical amplifier according to claim 3 wherein the first length L1 is in a range of 100 μm to 1 mm and wherein the second length L2 is in a range of 1 mm to 4 mm.

5. The multi-section semiconductor optical amplifier according to claim 1, wherein input section and the output section are formed by a same active region.

6. The multi-section semiconductor optical amplifier according to claim 5, further including a substrate, a buffer layer on the substrate, the active region on the buffer layer, and at least one cladding layer on the active region, wherein the active region includes first bottom SCH layer extending only in the output section and a second bottom SCH layer extending across both the input section and the output section.

7. The multi-section semiconductor optical amplifier according to claim 6, wherein the active region further includes a MQW layer on the second bottom SCH layer and a top SCH layer on the MQW layer.

8. The multi-section semiconductor optical amplifier according to claim 1, wherein the input section and the output section are formed by different active regions.

9. The multi-section semiconductor optical amplifier according to claim 8, further including a substrate, a buffer layer on the substrate, first and second active regions on the buffer layer and in the input section and the output section, respectively, and at least one cladding layer on the active regions.

10. The multi-section semiconductor optical amplifier according to claim 9, wherein the first active region includes a first bottom SCH layer and a first MQW layer on the first bottom SCH layer and a first top SCH layer on the first MQW layer and wherein the second active region includes a second bottom SCH layer and a second MQW layer on the second bottom SCH layer and a second top SCH layer on the second MQW layer, and wherein the first and second optical confinement factors $\Gamma 1$, $\Gamma 2$, are provided by different SCH thicknesses, different SCH compositions and/or different MQW layers.

11. The multi-section semiconductor optical amplifier according to claim 1, wherein the input section and the output section include separate confinement heterostructure (SCH) layers that are configured to provide the first optical confinement factor that is higher than the second optical confinement factor.

12. The multi-section semiconductor optical amplifier according to claim 11, wherein different thicknesses of the SCH layers provide the first optical confinement factor that is higher than the second optical confinement factor.

13. The multi-section semiconductor optical amplifier according to claim 11, wherein the SCH layers are not tapered.

* * * * *